United States Patent [19]

Hynecek

[11] Patent Number: 5,317,174
[45] Date of Patent: May 31, 1994

[54] BULK CHARGE MODULATED DEVICE PHOTOCELL

[75] Inventor: Jaroslav Hynecek, Richardson, Tex.

[73] Assignee: Texas Instruments Incorporated, Dallas, Tex.

[21] Appl. No.: 19,516

[22] Filed: Feb. 19, 1993

[51] Int. Cl.$^5$ .......................................... H01L 27/14
[52] U.S. Cl. ................................ 257/222; 257/229; 257/290; 257/291; 257/448; 257/72
[58] Field of Search ............... 257/290, 291, 292, 293, 257/294, 72, 20, 21, 443, 448, 222, 223, 229, 230

[56] References Cited

U.S. PATENT DOCUMENTS

| | | | |
|---|---|---|---|
| 4,077,044 | 2/1978 | Hayashi | 257/364 X |
| 4,644,402 | 2/1987 | Yamada | 257/222 X |
| 4,757,365 | 7/1988 | Boudewijns | 257/222 X |
| 4,901,129 | 2/1990 | Hynecek | 357/30 |
| 5,192,990 | 3/1993 | Stevens | 257/222 X |

OTHER PUBLICATIONS

Hynecek, "BCMD-An Improved Photosite Structure for High-Density Image Sensors," *IEEE Transactions on Electron Devices*, vol. 38, No. 5, May 1991, pp. 1011-1019.

Forbes et al., "Characteristics of the Indium-Doped Infrared Sensing MOSFET (IRFET)", *IEEE Transactions on Electron Devices*, vol. Ed-23, No. 12, Dec. 1976, pp. 1272-1278.

"BCMD-An Improved Photosite Structure for High--Density Image Sensors," Jaroslav Hynecek, IEEE Transactions on Electron Devices, vol. 38, No. 5, May 1991, pp. 1011-1020.

Primary Examiner—William Mintel
Attorney, Agent, or Firm—Alan K. Stewart; Richard L. Donaldson; William E. Hiller

[57] ABSTRACT

A bulk charge modulated MOSFET for sensing light comprising a semiconductor substrate with a gate region of a first conductivity type formed in the substrate. The gate region forms a potential well for carriers of the first conductivity type. The well is formed at a substantial depth from the surface of the gate region. The carriers are formed responsive to incident light. The gate region collects the carriers generated at depths less than the well. A source region of a second conductivity type is formed in the semiconductor substrate laterally adjacent the gate region. The source region is operable to sense a change in threshold voltage of the MOSFET responsive to the collection of carriers by the gate region. A drain region of the second conductivity type is formed in the layer adjacent the gate region and spaced from the source. The drain region is connected to a voltage source. The voltage source is pulsed to create a large potential well that extends under the gate region from the source to the drain during charge integration period and a smaller potential well during readout period.

18 Claims, 3 Drawing Sheets

BULK CHARGE MODULATED DEVICE PHOTOCELL

FIELD OF THE INVENTION

This invention generally relates to image sensor elements, and more particularly relates to bulk charge modulated image sensors.

BACKGROUND OF THE INVENTION

A bulk charge modulated device (BCMD) photocell is a device used in high performance image sensors for conversion of photon generated charge to an output signal. The photocell is a MOS phototransistor that has a potential well formed under the transistor channel. When the MOS phototransistor is illuminated, photogenerated charges are stored in the potential well. As charge accumulates in this potential well, the transistor threshold is modulated. This modulation is detected by a suitable signal processing circuit. The circuit is sensitive only to the threshold changes caused by light. This is important for elimination of random cell-to-cell fixed pattern noise otherwise induced by the fixed transistor threshold variations.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
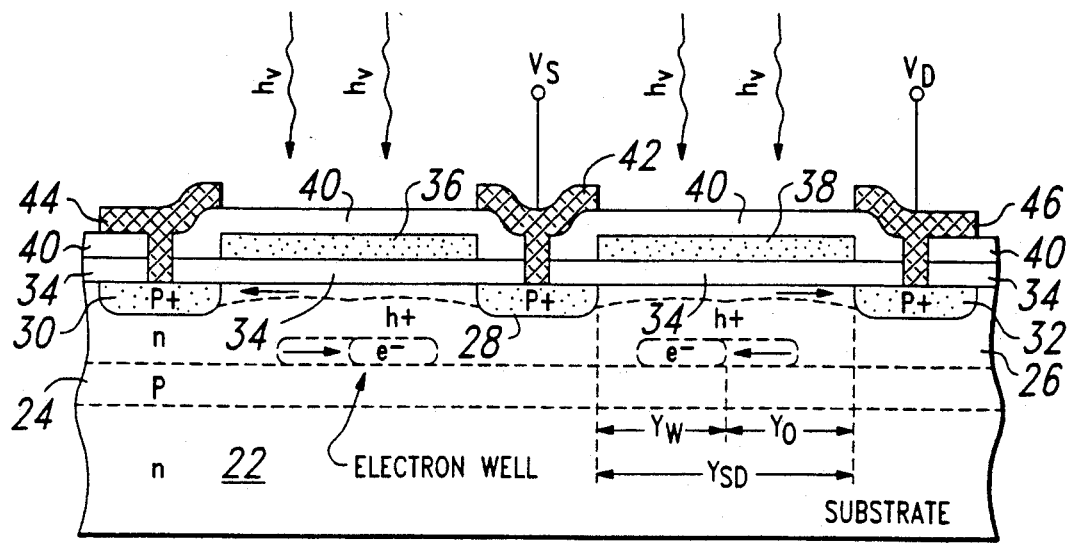
FIG. 1 is a schematic cross-section of a first preferred embodiment of the invention.

Referring to FIG. 1, a schematic cross section of a first preferred embodiment is shown. The circuit 20 of FIG. 1 contains N type semiconductor substrate 22, P type layer 24, N type layer 26, P+ source 28, P+ drains 30 and 32 which are connected in the circular geometry layout of the circuit, first insulator layer 34 (silicon dioxide), gates 36 and 38 (polysilicon) which are connected in the circular geometry, second insulator layer 40 (silicon dioxide), source electrode 42, and drain electrodes 44 and 46 which are connected in the circular geometry.

Referring to FIG. 1, a method of forming the first preferred embodiment is described. Beginning with an N type substrate 22, a P type layer 24 is formed over the substrate 22. Next, an N type layer 26 is formed over the P type layer 24. An insulator layer 34 such as silicon dioxide is then formed over the surface of the structure. Insulator layer 34 forms the gate insulator layer. The gates 36 and 38 are formed over the insulator layer 34. The gates 36 and 38 are formed of a relatively refractory, conductive, and at least light-translucent layer, such as doped polysilicon or, more preferably, doped tin oxide. For polysilicon gates, from 500 to 5000 Angstroms of a polysilicon layer is deposited, doped, patterned, and etched to form gates 36 and 38.

In place of polysilicon, gates 36 and 38 can be formed of tin oxide. A tin oxide layer may be deposited by a forced-plasma low-pressure chemical vapor deposition in a plasma reactor. Tetramethyltin and carbon dioxide can be used as the gas reactants in order to deposit the tin oxide layer. To render the tin oxide layer conductive, the reacting gas can contain a small amount of phosphoric oxytrichloride (POCL3) or phosphorous trichloride (PC13) in the reactant mixture. The tin oxide layer may be patterned using an oxide mask and etched using hydrogen iodide as entrained onto the gas flow of an inert gas such as nitrogen. The etch should take place at a temperature below 450 degrees C. Doped tin oxide is a preferred conductor material because of its high transparency relative to polysilicon. Further, it is highly resistant to subsequent annealing, etching, and oxidation steps.

After the gates 36 and 38 are patterned and etched, they can be used in a self-aligned process as a mask for an implantation of P+ source 28, and P+ drains 30 and 32. A dopant such as boron is implanted into N type layer 26 to form the P+ regions, shown in FIG. 1. Then an insulator layer 40 is formed over the surface of the structure. Insulator layer 40 can be formed of oxide. Next, contact openings to the source 28 and to the drains 30 and 32 are etched through the two insulator layers 34 and 40. Then a conductive layer is deposited and etched to form source electrode 42, and drain electrodes 44 and 46.

Figure 2:
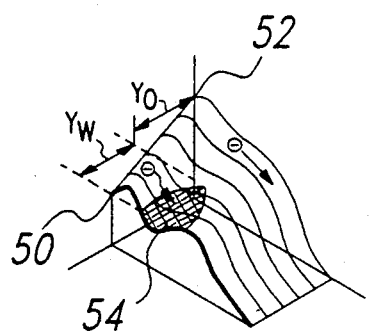
FIG. 2 is a two dimensional potential diagram of the invention in the source-follower mode.

When the transistor is biased as a source-follower, the potential profile (from interface to bulk) is not the same at each point along the transistor channel. Near the source region 50 the potential profile is near ideal as shown in FIG. 2, however near the drain 52, the potential profile corresponds to the case of reset bias. This leads to a substantial region Yo of the cell not being able to collect the photon generated electrons which then escape to the substrate. This is illustrated by the two dimensional potential diagram shown in FIG. 2.

The potential diagram of FIG. 2 is of the gate region between the source region 50 and the drain region 52 covering the distance Ysd shown in FIG. 1. In FIG. 2 the potential well extends only under a portion of the gate electrode because the transistor is in the source-follower mode. Only the electrons generated in the region Yw will be collected in the well 54. The electrons generated in the region Yo will escape to the substrate.

The transistor must operate in the source-follower mode in order to read out the detected signal, and the profile must be adjusted such that a complete reset is achieved. However, since the potential well does not extend under the full width of the gate electrode during the source-follower mode, the quantum efficiency during the charge integration period is low if the transistor remains in the source follower mode during the integration period.

This invention solves this problem by pulsed operation of the drain voltage. The drain voltage is switched when the circuit goes from the readout period to the charge integration period. During readout, the drain voltage is lower (the transistor is in the source-follower mode) than during charge integration. During the charge integration period the drain can be connected to the source so that both the drain and source will be at a higher potential. The source-follower mode is necessary only during a short period of time for signal readout. The pulsed voltage operation is demonstrated in FIGS. 3 and 4.

Figure 3:
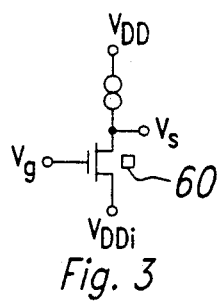
FIG. 3 is a circuit diagram of the structure of FIG. 1.
Figure 4:
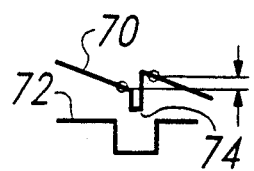
FIG. 4 is a waveform diagram of the source voltage and drain voltage of the device of FIG. 1.

FIG. 3 is a circuit diagram of the BCMD MOS transistor. Vg is the gate voltage. Vddi is the drain voltage. Vs is the source voltage or output voltage. The bulk well is region 60. FIG. 4 shows the source output voltage 70 and the drain voltage 72. When the drain voltage 72 is high, the transistor is in the charge integration state. When the drain voltage 72 is low, the transistor is in the source-follower state. As shown in FIG. 4, the transistor only needs to be in the source-follower state for the short period of time during signal readout.

Figure 5:
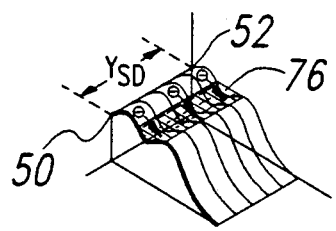
FIG. 5 is a two dimensional potential diagram of the invention in the integration mode.

Referring now to FIG. 5, a two dimensional potential diagram of the invention in the integration state with a higher drain bias is shown. The potential diagram is of the gate region between the source 50 and the drain 52 covering the distance Ysd shown in FIG. 1. During the charge integration state the source and drain of the photocell can be connected together and biased at a higher potential to make sure that the bulk charge well 76 extends completely under the whole transistor region covering the distance Ysd, as shown in FIG. 5. Because the charge well 76 extends from the source 50 to the drain region 52 completely, electrons cannot escape to the substrate when they are generated by light. This guarantees a high quantum efficiency and also a good uniformity from cell to cell.

Figure 6:
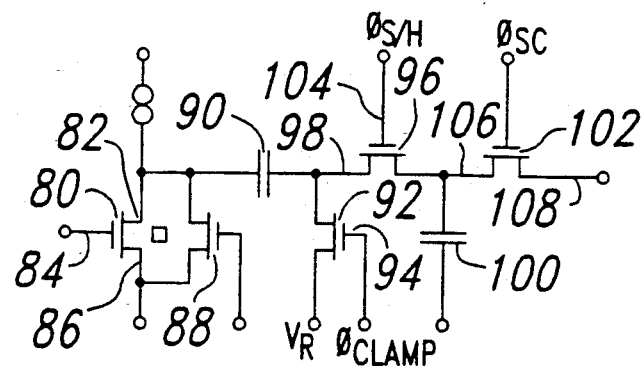
FIG. 6 is a complete circuit of the improved BCMD photocell and low dark current operation.

A complete circuit of the improved BCMD photocell and low dark current operation is shown in FIG. 6. A photocell according to the invention is indicated generally at 80. Photocell 80 has a source region 82 that is connected to a supply voltage source Vdd; a gate region 84; and a drain 86 that is connected to a voltage source Vddi. The source-drain region of a column clamp transistor 88 is connected across the source-drain region of the photocell 80. The source 82 of the photocell 80 is further connected to a coupling capacitor 90. The coupling capacitor 90 is in turn connected to a reference voltage Vr through a clamping transistor 92. Clamping transistor 92 has a gate 94 that is controlled by a pulse source Phi(clamp).

A line 98 further connects coupling capacitor 90 to a sampling transistor 96. Sampling transistor 96 has a current path that connects line 98 to a holding capacitor 100. Sampling transistor 96 also connects line 98 to a scanner transistor 102. Sampling transistor 96 has a gate 104 that is connected to a source phi(s/h). The scanner transistor 102 has a current path that connects line 106 to a sense line 108 to an output sense amplifier (not shown). The gate of the scanner transistor 102 is connected to a source phi(sc).

The column clamp transistor 88 is turned on during the integration time. This equalizes the source 82 and drain 86 bias of the photocell 80. The level of the drain voltage Vddi during the charge integration period is important. The drain voltage needs to be high enough so that the holes from the source and drain fill the transistor channel. The holes in the channel fill the interface states and prevent surface generation of the dark current, and also eliminates the parasitic surface electron well.

Figure 7:
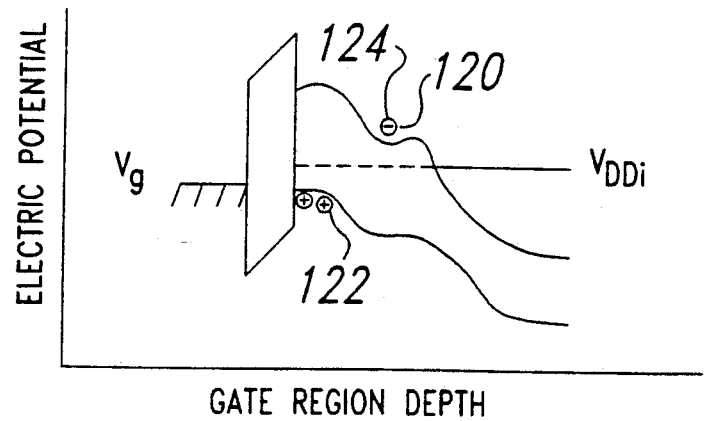
FIG. 7 is a potential band diagram of an image sensor element according to the invention.

Referring now to FIG. 7, a potential band diagram of the sensor element according to the invention is illustrated. Vg represents the applied gate bias. The two curves are the potential curves for the conduction band and the valence band of the semiconductor substrate at the gate region. The curves show an electron potential well 120 formed a substantial distance into the semiconductor layer, and hole current channel 122 which is near the surface.

If light is allowed to enter the structure of the invention, the electrons 124 generated in the depletion region will be collected in potential well 120. The charge accumulated at well 120 will substantially alter the potential profile. For detection of a threshold voltage differential, the transistor gate voltage is pulsed. After transferring out the accumulated charge, the element becomes ready for integration of a new electron charge packet.

During the reset pulse 74, shown in FIG. 4, electrons are emptied from the bulk charge well 120, shown in FIG. 7. For the proper device operation it is necessary that the well is completely emptied during the reset. This means that the potential profile has no valley during this time.

Figure 8:
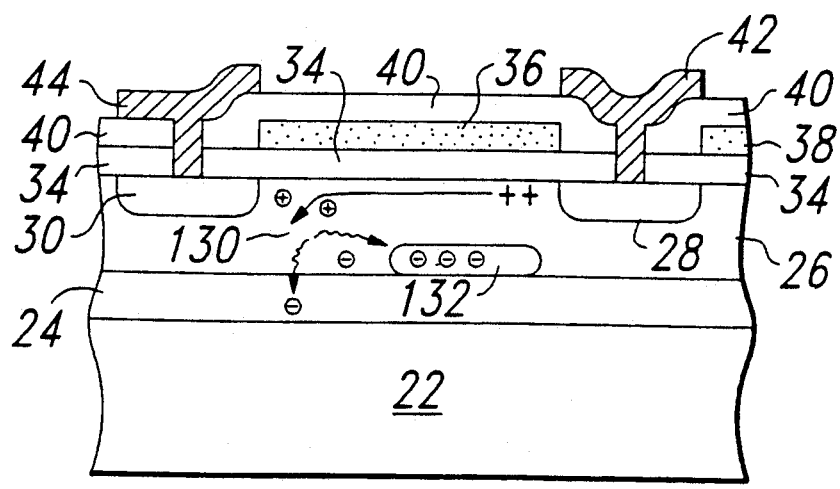
FIG. 8 is a schematic cross-section of a portion of the structure shown in FIG. 1 which shows impact ionization that occurs during the source-follower mode.

An additional advantage of the pulsed Vddi operation is shown in FIG. 8. During the source-follower mode of operation, there is a large field present in the vicinity of the drain 30. The holes flowing in the transistor channel cause an impact ionization and generation of new electron-hole pairs 130, as shown in FIG. 8. The impact generated electrons can then be collected in the bulk charge well 132 and contribute to an undesirable dark current signal. This undesirable effect is minimized by operating the BCMD transistor in the source-follower sensing mode only for a very short readout time.

The impact ionization current is some times called the transistor substrate current. It can be minimized by profiling the drain junction. It is also smaller for holes, so it is advantageous to select the P-channel transistor as a photocell structure in the BCMD concept. Various methods exist for profiling the drain junction such as dual impurity diffusions and lightly doped drain.

Figure 9:
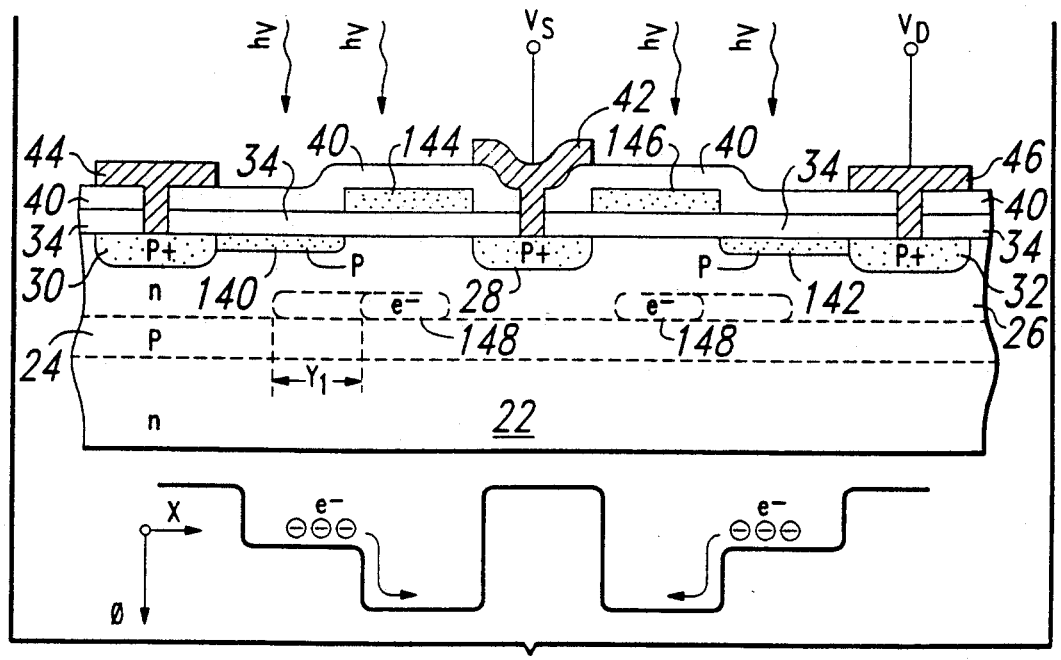
FIG. 9 is a schematic cross-section of a second preferred embodiment of the invention.

A second preferred embodiment of the invention is shown in FIG. 9. The structure of this embodiment is the same as for the first preferred embodiment shown in FIG. 1, except for the lightly doped drain regions 140 and 142 which are connected in the circular geometry, and the narrower gates 144 and 146 which are also connected. The principle of operation of this embodiment is the same as the first embodiment. The difference is that the gates 144 and 146 are now much smaller which results in a smaller capacitance device and thus in higher conversion gain.

During the integration period Vddi is biased at a higher voltage than during the readout period. This higher voltage extends the charge well 148 by a distance Y1. This results in higher quantum efficiency. During the readout Vddi is biased at a lower voltage, which concentrates electrons into a smaller well under the smaller transistor which has smaller capacitance and thus higher conversion gain.

Additional benefits of the structure of FIG. 9 are that the gates 144 and 146 do not block the light as much as in the first embodiment. This increases the quantum efficiency particularly in the blue region of the light spectrum. Smaller MOS transistor area also results in smaller surface generated dark current, and higher gain which leads to a higher speed device.

A variable quantum efficiency photocell is created by varying the width of the drain voltage pulse 72, shown in FIG. 4. By changing the pulse width of the drain voltage, the transistor can be in a low quantum efficiency state for longer periods of time.

Figure 10:
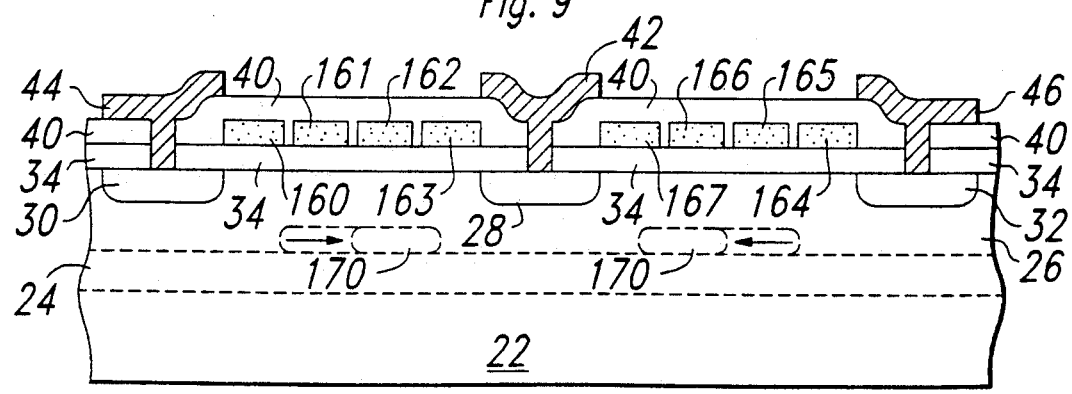
FIG. 10 is a schematic cross-section of a third preferred embodiment of the invention.

Another technique for a variable quantum efficiency photocell is demonstrated by a third preferred embodiment shown in FIG. 10. FIG. 10 is a schematic cross section of a third preferred embodiment. The difference between this embodiment and the embodiment of FIG. 1 is that the gates are divided into four sections each, 160-163 and 164-167. Each section of the gate has an independent voltage control so that the potential profile along the transistor channel can be controlled by suitable gate biases. This allows the width of the bulk charge well 170 to be varied along the length of the channel between the source 28 and the drains 30 and 32. While this embodiment has been described with each gate divided into four sections, this is not intended to be construed in a limiting sense. The gate could be divided into any number of sections depending on the desired level of variability of the charge well.

Figure 11:
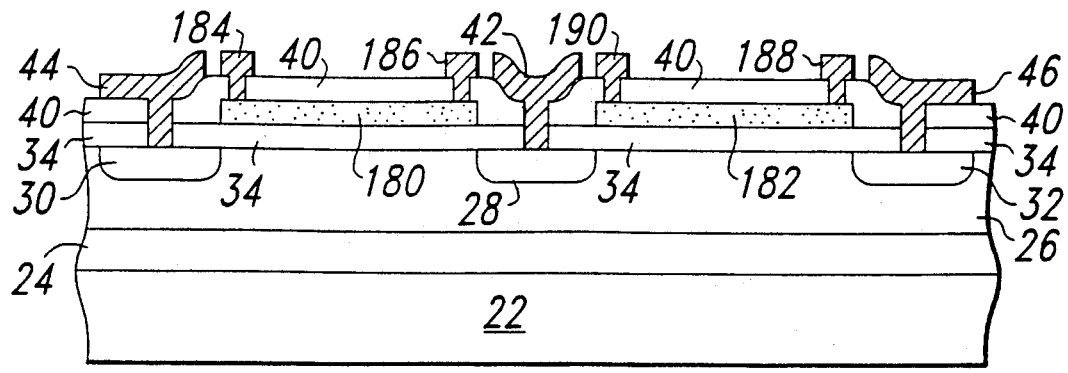
FIG. 11 is a schematic cross-section of a fourth preferred embodiment of the invention.

Referring to FIG. 11, a schematic cross-section of a fourth preferred embodiment is shown. The difference between this embodiment and the embodiment shown in FIG. 1 is that the gates 180 and 182 are resistive and are connected to electrodes 184, 186, 188, and 190 that allow current to flow across the gates in the direction from the source 28 to the drains 30 and 32. The current flowing across the gates 180 and 182 creates a potential variation across the width of the gate. By changing the current which flows across the gate, the charge well width can be varied. This embodiment provides another technique for varying the quantum efficiency of the photocell.

There are several advantages of a variable quantum efficiency device. The device can be used as an iris in the image sensor devices employing the BCMD cell. Iris function is important for exposure and overload control, since it eliminates expensive mechanical lens iris. The variable quantum efficiency device is also important for the modulation transfer function (MTF) of the photocell. It is possible to electronically vary MTF from cell to cell, therefore changing the response for spacial frequencies above the fundamental cell frequency. It is possible to achieve sub pixel resolution with a suitable image processing system.

A variable quantum efficiency device simulates the function of the lens mechanical iris (or human eye iris). This is accomplished on a pixel by pixel level which can be externally or automatically internally controlled. A device which can change the quantum efficiency pixel by pixel depending on the illumination level of each pixel will expand the dynamic range of the image sensor and open wide applications for complex image processing.

A few preferred embodiments have been described in detail hereinabove. It is to be understood that the scope of the invention also comprehends embodiments different from those described, yet within the scope of the claims.

For example, all conductivity types herein describe may be reversed. The MOS transistor could be P channel instead of N channel, and all further elements of the structure would have similarly reversed conductivity types.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bulk charge modulated MOSFET for sensing light comprising:
   a semiconductor layer of a first conductivity type;
   a transistor channel of a second conductivity type formed in the semiconductor layer, the transistor channel including a potential well for carriers of the first conductivity type, the well formed at a substantial depth from the surface of the transistor, the carriers formed responsive to incident light, collecting in the potential well;
   a source region of the second conductivity type formed in the semiconductor layer laterally adjacent the transistor channel, the source region operable to sense a change in threshold voltage of the MOSFET channel responsive to the collection of carriers by the potential well;
   a drain region of the second conductivity type formed in the semiconductor layer adjacent the transistor channel and spaced from the source region, the drain region is connected to a voltage source, the voltage source is pulsed to create a wide potential well that extends across the transistor channel from the source region to the drain region during a charge integration period and a narrow potential well during a readout period.

2. The device of claim 1, further comprising:
   an insulator region formed over the semiconductor layer;
   a gate formed over the insulator region between the source and drain regions.

3. The device of claim 2, wherein the gate extends over the distance between the source region and the drain region.

4. The device of claim 2, further comprising:
   a lightly doped drain region extending from the drain region in the direction towards the source region.

5. The device of claim 4, wherein the gate extends over the distance between the source region and the lightly doped drain region.

6. The device of claim 2, wherein the gate includes at least two electrically isolated regions.

7. The device of claim 2, wherein the gate is a resistive electrode having conductive contacts, the conductive contacts are connected to a variable voltage source, the variable voltage source creates a variable electric current that flows through the gate in the direction from the source region to the drain region.

8. The device of claim 7, wherein the variable electric current varies a width of a potential well below the gate.

9. A device for sensing light comprising:
   a first semiconductor layer of a first conductivity type;
   a source region of a second conductivity type in the first semiconductor layer, a first high voltage is applied to the source region during charge integration and a second high voltage is applied to the source region during readout;

a drain region of the second conductivity type in the first semiconductor layer and spaced apart from the source region, a third high voltage is applied to the drain region during charge integration and a low voltage is applied to the drain region during readout, the low voltage is lower than the second high voltage;

an insulator layer over the first semiconductor layer, and;

a gate on the insulator layer over a portion of the first semiconductor layer between the source region and the drain region.

10. The device of claim 9 further comprising a second semiconductor layer of a second conductivity type below the first semiconductor layer.

11. The device of claim 10 further comprising a semiconductor substrate of a first conductivity type below the second semiconductor layer.

12. The device of claim 9 further comprising a lightly doped drain region extending from the drain region in the direction towards the source region.

13. A device for sensing light comprising:

a first semiconductor layer of a first conductivity type;

a source region of a second conductivity type in the first semiconductor layer;

a drain region of the second conductivity type in the first semiconductor layer and spaced apart from the source region;

an insulator layer over the first semiconductor layer, and;

a gate on the insulator layer over a portion of the first semiconductor layer between the source region and the drain region, the gate consists of at least two electrically isolated regions.

14. The device of claim 13 wherein each electrically isolated region has an independent voltage control.

15. The device of claim 14 wherein a potential profile below the gate is controlled by the independent voltage controls.

16. A device for sensing light comprising:

a first semiconductor layer of a first conductivity type;

a source region of a second conductivity type in the first semiconductor layer;

a drain region of the second conductivity type in the first semiconductor layer and spaced apart from the source region;

an insulator layer over the first semiconductor layer, and;

a gate on the insulator layer over a portion of the first semiconductor layer between the source region and the drain region, the gate is a resistive region;

a first conductive contact coupled to a first portion of the gate near the source region; and a second conductive contact coupled to a second portion of the gate near the drain region.

17. The device of claim 16 wherein the first and second conductive contacts are coupled to opposite poles of a variable voltage source.

18. The device of claim 17 wherein the variable voltage source varies a width of a potential well below the gate.

* * * * *